United States Patent
Park et al.

(10) Patent No.: US 9,673,133 B2
(45) Date of Patent: Jun. 6, 2017

(54) SEMICONDUCTOR DEVICES HAVING THROUGH-ELECTRODES

(71) Applicants: Jae-Hwa Park, Yongin-si (KR); Kwangjin Moon, Hwaseong-si (KR); Byung Lyul Park, Seoul (KR); Sukchul Bang, Yongin-si (KR)

(72) Inventors: Jae-Hwa Park, Yongin-si (KR); Kwangjin Moon, Hwaseong-si (KR); Byung Lyul Park, Seoul (KR); Sukchul Bang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/939,394

(22) Filed: Nov. 12, 2015

(65) Prior Publication Data
US 2016/0133545 A1    May 12, 2016

(30) Foreign Application Priority Data
Nov. 12, 2014 (KR) .................. 10-2014-0157409

(51) Int. Cl.
| H01L 23/48 | (2006.01) |
| H01L 23/50 | (2006.01) |
| H01L 23/528 | (2006.01) |

(52) U.S. Cl.
CPC ............ *H01L 23/481* (2013.01); *H01L 23/50* (2013.01); *H01L 23/528* (2013.01); *H01L 2224/13* (2013.01); *H01L 2924/0002* (2013.01)

(58) Field of Classification Search
CPC ........ H01L 23/48; H01L 23/481; H01L 23/50
See application file for complete search history.

(56) References Cited

U.S. PATENT DOCUMENTS

| 7,161,089 | B2 | 1/2007 | Sasaki et al. |
| 8,174,124 | B2 | 5/2012 | Chiu et al. |
| 8,390,120 | B2 | 3/2013 | Moon et al. |
| 8,592,310 | B2 | 11/2013 | Park et al. |
| 8,629,059 | B2 | 1/2014 | Lee et al. |
| 2006/0046475 | A1* | 3/2006 | Wark ............... H01L 21/486 438/667 |
| 2009/0305502 | A1* | 12/2009 | Lee ............... H01L 21/76898 438/667 |
| 2010/0102454 | A1* | 4/2010 | Akiyama ........ H01L 21/76898 257/774 |
| 2011/0254165 | A1* | 10/2011 | Muranaka ...... H01L 21/76832 257/751 |

(Continued)

FOREIGN PATENT DOCUMENTS

| JP | 2012243953 | 12/2012 |
| JP | 2013105957 | 5/2013 |
| JP | 2014-011248 | 1/2014 |

*Primary Examiner* — Peniel M Gumedzoe
(74) *Attorney, Agent, or Firm* — Myers Bigel, P.A.

(57) ABSTRACT

Semiconductor devices having through-electrodes are provided. The semiconductor devices may include a substrate, a through-electrode penetrating vertically through the substrate, a circuit layer on the substrate and metal lines in the circuit layer. The metal lines may include two first metals on opposing edges of a top surface of the through-electrode and second metals above the top surface of the through-electrode. At least some of the second metals may not vertically overlap the two first metals.

20 Claims, 9 Drawing Sheets

(56) References Cited

U.S. PATENT DOCUMENTS

| | | | |
|---|---|---|---|
| 2011/0316168 A1* | 12/2011 | Moon | H01L 23/481 257/774 |
| 2012/0199970 A1* | 8/2012 | Yun | H01L 23/481 257/737 |
| 2013/0020719 A1 | 1/2013 | Jung et al. | |
| 2013/0181317 A1 | 7/2013 | Wakiyama et al. | |
| 2013/0285055 A1 | 10/2013 | Takayanagi | |
| 2014/0131841 A1* | 5/2014 | Tseng | H01L 23/481 257/621 |
| 2014/0162449 A1 | 6/2014 | An et al. | |
| 2014/0346668 A1 | 11/2014 | Mitsuhashi | |

* cited by examiner

SEMICONDUCTOR DEVICES HAVING THROUGH-ELECTRODES

CROSS-REFERENCE TO RELATED APPLICATION

This U.S. non-provisional patent application claims priority under 35 U.S.C. §119 to Korean Patent Application 10-2014-0157409, filed on Nov. 12, 2014, the disclosure of which is hereby incorporated by reference in its entirety.

BACKGROUND

The inventive concept relates to a semiconductor device and, more particularly, to a semiconductor device having a through-electrode.

A through-electrode penetrating a substrate has been suggested to electrically connect a semiconductor device to another semiconductor device or to a printed circuit board. The through-electrode can be used to fabricate a three-dimensional semiconductor device and can increase transmit speed as compared to a conventional solder bump.

SUMMARY

A semiconductor device may include a semiconductor substrate, a through-electrode penetrating vertically through the semiconductor substrate, a circuit layer on the semiconductor substrate and a plurality of metal lines in the circuit layer. The plurality of metal lines may include two first metals on respective ones of opposing edges of a top surface of the through-electrode and a plurality of second metals above the top surface of the through-electrode. The plurality of second metals may be disposed above the two first metals, and at least some of the plurality of second metals may not vertically overlap the two first metals.

In various embodiments, the top surface of the through-electrode may have an oval shape that may have a longer axis and a shorter axis, and the opposing edges of the top surface of the through-electrode may be on the longer axis.

According to various embodiments, the plurality of second metals may extend in a direction that is substantially parallel to the shorter axis.

According to various embodiments, the two first metals are spaced apart from each other along the longer axis by a first distance, and a length of the top surface of the through-electrode along the longer axis may be greater than the first distance.

In various embodiments, no vertical line may exist that intersects both one of the two first metals and one of the at least some of the plurality of second metals.

In various embodiments, the device may further include a third metal above the plurality of second metals. The third metal may be electrically connected to at least one of the two first metals.

According to various embodiments, the device may also include a via between the third metal and the at least one of the two first metals to electrically connect the third metal to the at least one of the two first metals.

In various embodiments, the top surface of the through-electrode may be flat.

In various embodiments, the top surface of the through-electrode may be flat or recessed.

According to various embodiments, the through-electrode may penetrate a portion of the circuit layer.

A semiconductor device may include a semiconductor substrate including an active surface and an inactive surface opposite the active surface that are spaced apart from each other in a vertical direction, a through-electrode extending from the active surface to the inactive surface in the vertical direction so as to penetrate the semiconductor substrate and an interlayer dielectric layer on the active surface of the semiconductor substrate. The interlayer dielectric layer may include an integrated circuit therein. The device may also include two metal pads in the interlayer dielectric layer and on respective ones of opposing edges of a top surface of the through-electrode and at least one metal line in the interlayer dielectric layer. The at least one metal line may be disposed above the top surface of the through-electrode, and the at least one metal line may not vertically overlap the two metal pads.

In various embodiments, no vertical line may exist that intersects both one of the two metal pads and the at least one metal line.

According to various embodiments, the top surface of the through-electrode may have an oval shape that has a longer axis and a shorter axis.

In various embodiments, the two metal pads may contact the respective ones of the opposing edges of the top surface of the through electrode, and the opposing edges may be on the longer axis.

According to various embodiments, the two metal pads may be spaced apart from each other along the longer axis by a first distance, and a width of the top surface of the through-electrode along the longer axis may be greater than the first distance.

In various embodiments, the at least one metal line may extend in a direction that is substantially parallel to the shorter axis.

According to various embodiments, the top surface of the through-electrode may be recessed toward a bottom surface of the through-electrode that is adjacent the inactive surface of the substrate, and each of the two metal pads may have a portion extending downwardly toward the recessed top surface of the through-electrode.

A semiconductor device may include a through-electrode penetrating a semiconductor substrate, a metal pad on the semiconductor substrate and on a top surface of the through-electrode and a metal line above the top surface of the through-electrode. The through-electrode may extend in a vertical direction. The metal pad may include a first pad and a second pad that are disposed on respective ones of opposing edges of the top surface of the through-electrode, and the metal line may be between the first pad and the second pad such that the first and second pads do not vertically overlap the metal line.

In various embodiments, the top surface of the through-electrode may have an oval shape that has a longer axis and a shorter axis, and a width of the top surface of the through-electrode along the longer axis may be greater than a distance between the first pad and the second pad along the longer axis.

According to various embodiments, the metal line may extend in a direction that is substantially parallel to the shorter axis.

In various embodiments, the top surface of the through-electrode may be recessed toward a bottom surface of the through-electrode.

According to various embodiments, the device may further include an interlayer dielectric layer on the semiconductor substrate and an integrated circuit in or on the semiconductor substrate. The interlayer dielectric layer may extend on the metal pad and the metal line, and the integrated circuit may be disposed under the interlayer dielectric layer.

In various embodiments, the through-electrode may penetrate a portion of the interlayer dielectric layer.

A semiconductor device may include at least one chip stack mounted on a package substrate. The at least one chip stack may include a base chip on the package substrate and at least one memory chip on the base chip. The memory chip may include a semiconductor substrate including a through-electrode penetrating therethrough, a memory circuit layer on the semiconductor substrate and a plurality of metal lines in the memory circuit layer. The through-electrode may extend in a vertical direction. The plurality of metal lines may include two metal pads on respective opposing edges of a top surface of the through-electrode and at least one metal line on the top surface of the through-electrode and between the two metal pads not to vertically overlap the metal pads.

In various embodiments, the top surface of the through-electrode may have an oval shape that has a longer axis and a shorter axis, and a width of the top surface of the through-electrode along the longer axis may be greater than a distance between the two metal pads along the longer axis.

According to various embodiments, the opposing edges of the top surface of the through-electrode may be on the longer axis, and the at least one metal line may extend in a direction that is substantially parallel to the shorter axis.

According to various embodiments, the device may further include an interposer between the package substrate and at least one chip stack.

In various embodiments, the device may further include a system-on-chip mounted on the package substrate.

A semiconductor device may include a through-electrode extending through a substrate and first and second lower metal patterns on the substrate. The first and second lower metal patterns may contact respective ones of opposing edge portions of an upper surface of the through-electrode and may be spaced apart from each other to expose a central portion of the upper surface of the through-electrode. The device may also include a plurality of upper metal patterns above the first and second lower metal patterns. At least some of the plurality of upper metal patterns may be disposed above the central portion of the upper surface of the through-electrode.

In various embodiments, the upper surface of the through-electrode may have a non-circular shape.

According to various embodiments, the upper surface of the through-electrode may have a longer axis and a shorter axis, and the opposing edge portions of the upper surface of the through-electrode may be on the longer axis of the upper surface of the through-electrode.

In various embodiments, the central portion of the upper surface of the through-electrode may be at a level that is equal to or lower than an edge portion of the upper surface of the through-electrode.

According to various embodiments, the upper surface of the through-electrode may have an oval shape.

According to various embodiments, the plurality of upper metal patterns may extend in a direction that is substantially parallel to the shorter axis of the upper surface of the through-electrode.

According to various embodiments, the at least some of the plurality of upper metal patterns may not overlap the first and second lower metal patterns when viewed from a plan perspective.

According to various embodiments, the device may further include a dielectric layer on the central portion of the upper surface of the through-electrode.

BRIEF DESCRIPTION OF THE DRAWINGS

The foregoing and other features and advantages of example embodiments of the inventive concept will be apparent from the more particular description of non-limiting embodiments of the inventive concept. The drawings are not necessarily to scale, emphasis instead being placed upon illustrating the principles of the inventive concept. In the drawings.

DETAILED DESCRIPTION

Figure 1:
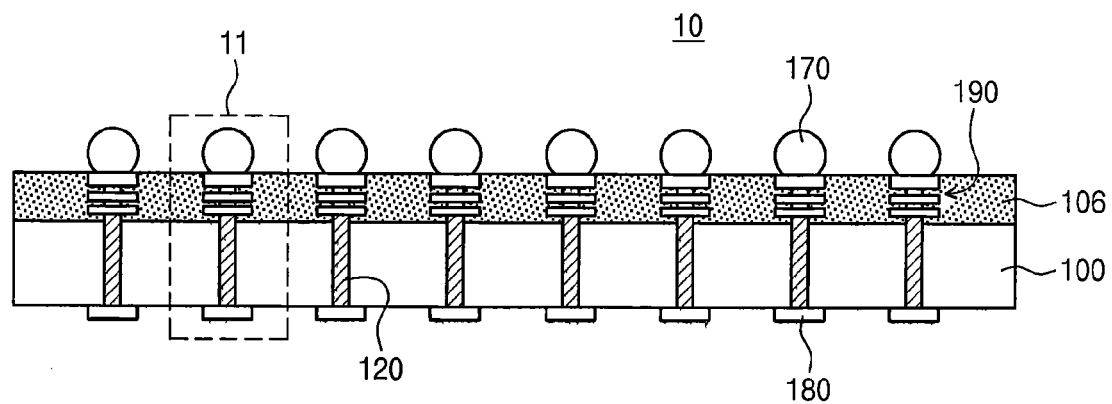
FIG. 1 is a cross-sectional view illustrating a semiconductor device according to example embodiments of the inventive concepts.

Example embodiments of the inventive concepts will be described more fully hereinafter with reference to the accompanying drawings. The inventive concepts may, however, be embodied in many different forms and should not be construed as being limited to the example embodiments set forth herein; rather, these example embodiments are provided so that this disclosure will be thorough and complete, and will fully convey the scope of the inventive concepts to those of ordinary skill in the art. In the drawings, thicknesses of layers and regions are exaggerated for clarity. Like reference numerals in the drawings denote like elements throughout.

Figure 2:
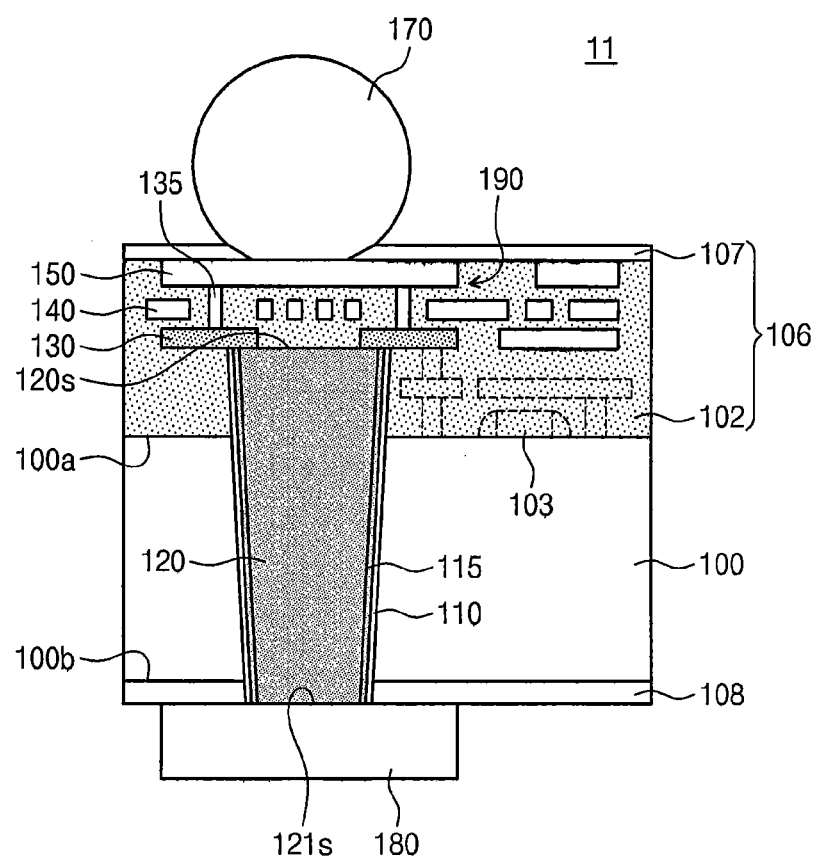
FIG. 2 is an enlarged cross-sectional view illustrating a portion of FIG. 1.

FIG. 1 is a cross-sectional view illustrating a semiconductor device according to example embodiments of the inventive concepts. FIG. 2 is an enlarged cross-sectional view illustrating a portion of FIG. 1.

Referring to FIG. 1, a semiconductor device 10 may comprise a circuit layer 106 provided on a semiconductor substrate 100 and a vertical interconnection 11 electrically connected to the circuit layer 106. The semiconductor device 10 may be a memory chip, a logic chip or a combination thereof. The semiconductor substrate 100 may be a wafer-level or chip-level silicon substrate. The vertical interconnection 11 may include a through-electrode 120 vertically penetrating the semiconductor substrate 100. The through-electrode 120 may further penetrate the circuit layer 106. Through the vertical interconnection 11, an electrical signal may pass through the semiconductor substrate 100 to be transmitted to the semiconductor device 10 or received from an outer electrical device.

Referring to FIG. 2, the vertical interconnection 11 may comprise the semiconductor substrate 100 including an active surface 100a and an inactive surface 100b, the through-electrode 120 vertically penetrating the semiconductor substrate 100, and the circuit layer 106 provided on the active surface 100a of the semiconductor substrate 100. The through-electrode 120 may be formed by a via middle scheme to penetrate the semiconductor substrate 100 and further penetrate a portion of the circuit layer 106.

The through-electrode 120 may include a flat top surface 120s. The top surface 120s of the through-electrode 120 may be at a level higher than that of the active surface 100a of the semiconductor substrate 100.

The vertical interconnection 11 may further include one of an upper terminal 170 and a lower terminal 180 that are electrically connected to the through-electrode 120. For example, the upper terminal 170 may include a solder ball and the lower terminal 180 may include a metal pad. The upper terminal 170 may be connected to the top surface 120s of the through-electrode 120 by multi-layered metal lines 190. The lower terminal 180 may be directly or indirectly connected to a bottom surface 121s of the through-electrode 120.

A lower insulating layer 108 may be provided on the inactive surface 100b of the semiconductor substrate 100 such that the lower terminal 180 may be electrically insulated from the semiconductor substrate 100. The through-electrode 120 may be electrically insulated from the semiconductor substrate 100 by a via insulating layer 110 which surrounds the through-electrode 120. A barrier layer 115 may be further provided between the via insulating layer 110 and the through-electrode 120 such that a component (e.g., copper) of the through-electrode 120 may not diffuse into the semiconductor substrate 100 and/or the circuit layer 106.

The circuit layer 106 may include an integrated circuit 103 provided on the active surface 100a of the semiconductor substrate 100, the metal lines 190 electrically connecting the integrated circuit 103 to the through-electrode 120, and an interlayer dielectric layer 102 covering the integrated circuit 103 and the metal lines 190.

The metal lines 190 may include a first metal 130, a second metal 140, a third metal 150, and a via 135. The via 135 may electrically connect the first metal 130 to the third metal 150. The number of metal lines may not be limited to three as illustrated in FIG. 2, and a plurality of vias 135 may be provided.

In some embodiments, the first metal 130 may include a plurality of metal lines including at least one metal pad coupled to the top surface 120s of the through-electrode 120. In some embodiments, the at least one metal pad is on or contacts the top surface 120s of the through-electrode 120. The second metal 140 may include at least one metal line extending over the top surface 120s of the through-electrode 120 and a plurality of metal lines extending over, for example, the integrated circuit 103. The third metal 150 may include at least one metal line including a metal pad coupled to the upper terminal 170.

The vertical interconnection 11 according to some embodiments of the inventive concepts may have a structure that reduces or possibly minimizes parasitic capacitances between the through-electrode 120 and the metal lines 190.

Figure 3A:
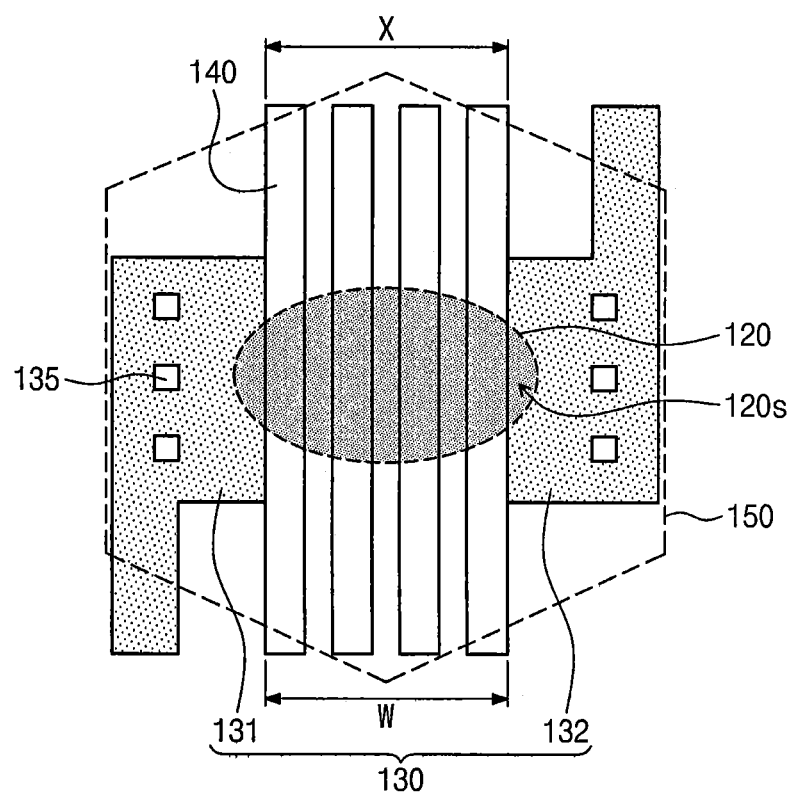
FIG. 3A is a plan view illustrating a portion of a semiconductor device according to example embodiments of the inventive concepts.
Figure 3B:
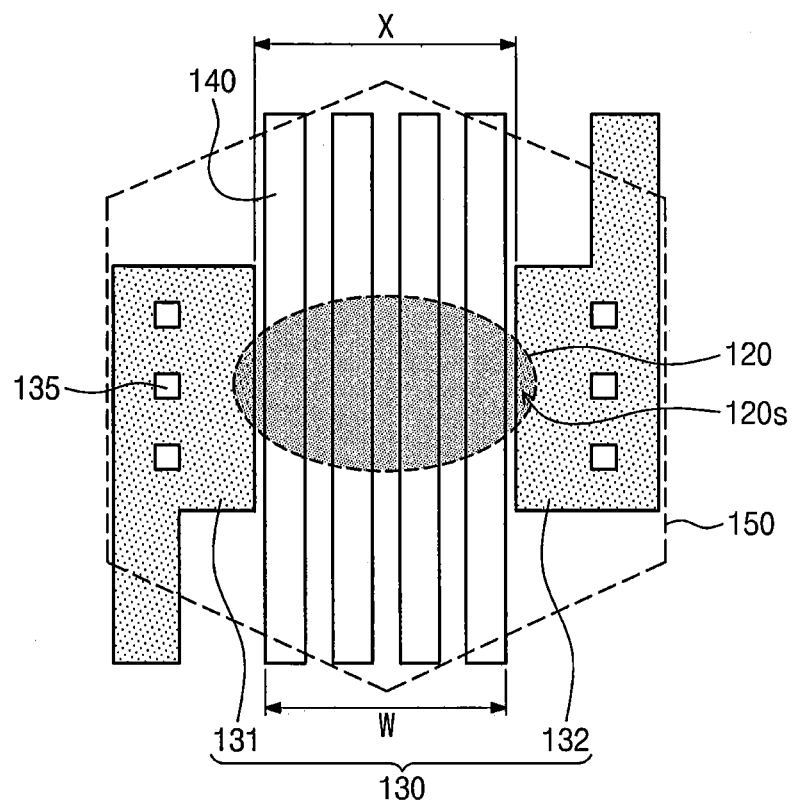
FIGS. 3B and 3C are plan views illustrating modified examples of FIG. 3A.
Figure 4A:
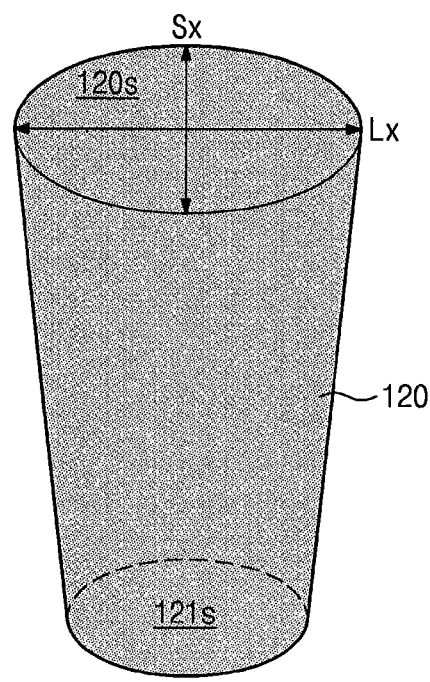
FIG. 4A is a perspective view of a through-electrode according to example embodiments of the inventive concepts.
Figure 4B:
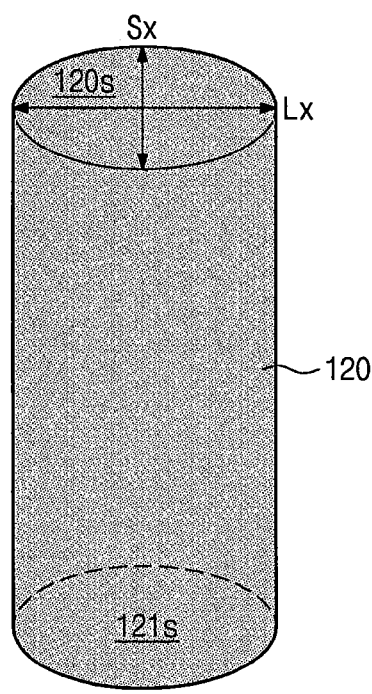
FIG. 4B is a perspective view of a through-electrode according to example embodiments of the inventive concepts.

FIG. 3A is a plan view illustrating a portion of a semiconductor device according to example embodiments of the inventive concepts. FIG. 3B is a plan view illustrating a modified example of FIG. 3A. FIG. 4A is a perspective view of a through-electrode according to example embodiments of the inventive concepts. FIG. 4B is a perspective view of a through-electrode according to example embodiments of the inventive concepts.

Referring to FIGS. 3A and 4A, the top surface 120s of the through-electrode 120 may have an elliptical or oval shape having a longer axis Lx and a shorter axis Sx. The bottom surface 121s of the through-electrode 120 may also have an elliptical or oval shape. The through-electrode 120 may have a shape whose longer axis Lx and shorter axis Sx gradually decrease toward the bottom surface 121s from the top surface 120s such that the bottom surface 121s may have an area less than that of the top surface 120s. In some embodiments, as shown in FIG. 4B, the through-electrode 120 may have a shape whose longer axis Lx and shorter axis Sx are substantially identical along a longitudinal direction of the through-electrode 120 such that the bottom surface 121s may have an area substantially the same as that of the top surface 120s.

The first metal 130 may include a plurality of fragments 131 and 132. In some embodiments, the first metal 130 may include a left first metal 131 and a right first metal 132 that are respectively coupled to left and right edge portions of the top surface 120s of the through-electrode 120, which are lying along the longer axis Lx. A width of a space X between the left first metal 131 and the right first metal 132 along the longer axis Lx may be less than a length of the top surface 120s along the longer axis Lx.

The first metal 130 and the third metal 150 may be electrically connected to each other by a plurality of vias 135 provided therebetween. The first metal 130 may include the left first metal 131 and the right first metal 132 that are separate from each other, but the left first metal 131 and right first metal 132 may be electrically connected to each other. In some embodiments, the left first metal 131 and right first metal 132 may function as pads that independently transmit electrical signals. In other words, a single through-electrode 120 may be electrically connected to the plurality of first metals 131 and 132 to independently transmit electrical signals.

At least one second metal 140 may be provided between the first metal 130 and the third metal 150. In particular, the at least one second metal 140 may be located at a vertical height above the top surface 120s of the through-electrode 120 that is greater than a vertical height of the first metal 130 above the top surface 120s and less than a vertical height of the third metal 150 above the top surface 120s. For example, a plurality of second metals 140 may be provided between the left first metal 131 and the right first metal 132. Each of the second metals 140 may extend in a direction that is substantially parallel to a direction of the shorter axis Sx of the top surface 120s. A vertical overlapping area between the second metal 140 and the oval top surface 120s of the through-electrode 120 may be reduced as discussed with reference to FIG. 5.

As shown in FIG. 3A, a width W of a region occupied by the plurality of second metals 140 between the left first metal 131 and the right first metal 132 may be substantially identical to the width of the space X between the left first metal 131 and the right first metal 132. As such, a right side of the left first metal 131 may be vertically aligned with a left side of a leftmost second metals 140. A left side of the right first metal 132 may be vertically aligned with a right side of a rightmost second metal 140.

In some embodiments, as shown in FIG. 3B, the width W of a region occupied by the plurality of second metals 140 between the left first metal 131 and the right first metal 132 may be less than the width of the space X between the left first metal 131 and the right first metal 132. The right side of the left first metal 131 may be horizontally spaced apart from the left side of the leftmost second metals 140, in a plan view, and the left side of the right first metal 132 may be horizontally spaced apart from the right side of the rightmost second metal 140, in a plan view.

Figure 3C:
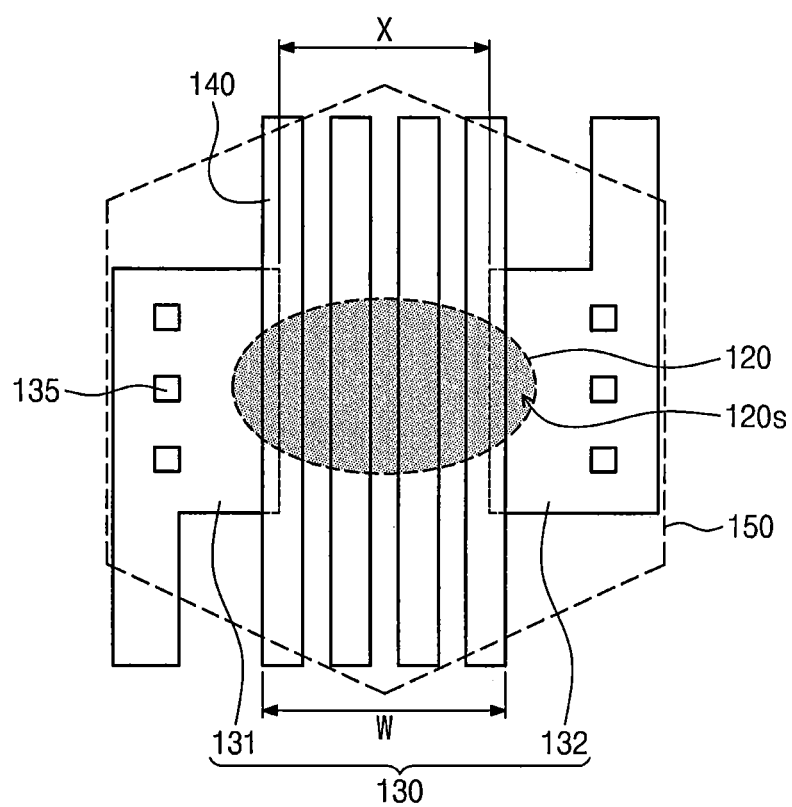

As illustrated in FIG. 3C, in some embodiments, the leftmost second metals 140 and the rightmost second metals 140 may partially overlap the left first metal 131 and the right first metal 132, respectively.

Figure 5:
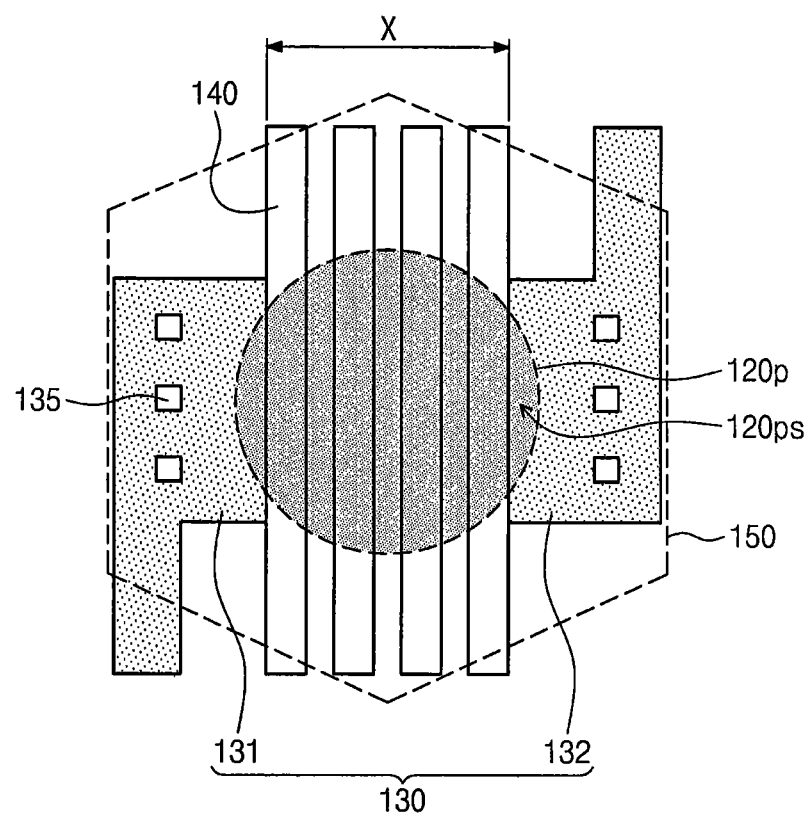
FIG. 5 is a plan view illustrating a comparative example of FIG. 3A.

FIG. 5 is a plan view illustrating a comparative example of FIG. 3A.

Referring to FIG. 5, if a top surface 120ps of a through-electrode 120p has a circular shape, a diameter of the top surface 120ps should be greater than the width of the space between the left first metal 131 and the right first metal 132 so as to connect the through-electrode 120p to the first metal 130.

If the top surface 120ps of the through-electrode 120p has a diameter substantially identical or similar to a length of the longer axis Lx of the top surface 120s of the through-electrode 120, an overlap area between the through-electrode 120p and the second metal 140 may be greater than an overlap area between the through-electrode 120 and the second metal 140. Moreover, the through-electrode 120p may need a greater keep-out zone compared to the through-electrode 120, and the greater keep-out zone may be an obstacle to increased integration.

If the top surface 120ps of the through-electrode 120p has a diameter less than the length of longer axis Lx of the top surface 120s of the through-electrode 120 to reduce the keep-out zone and/or the overlap area between the through-electrode 120p and the second metal 140, a contact area between the through-electrode 120p and the first metal 130 may be reduced such that an electrical connection may be poor.

In some embodiments, as shown in FIG. 3A, the top surface 120s of the through-electrode 120 has the oval shape such that sufficient contact area between the through-electrode 120 and the first metal 130 may be secured and a good electrical connection may be accomplished.

The reduction of the overlap area between the through-electrode 120 and the second metal 140 may reduce parasitic capacitance therebetween. Since the first metal 130 does not vertically overlap the second metal 140, a parasitic capacitance between the first metal 130 and the second metal 140 may also be reduced. In this case, a delay of electrical signal at the through-electrode 120 and/or the metal lines 190 may be reduced or possibly minimized. Additionally, the reduction of keep-out zone around the through-electrode 120 may contribute to increasing integration. It will be understood that references herein to "an element A not vertically overlapping an element B" (or similar language) means that no vertical line exists that intersects both the elements A and B.

Figure 6A:
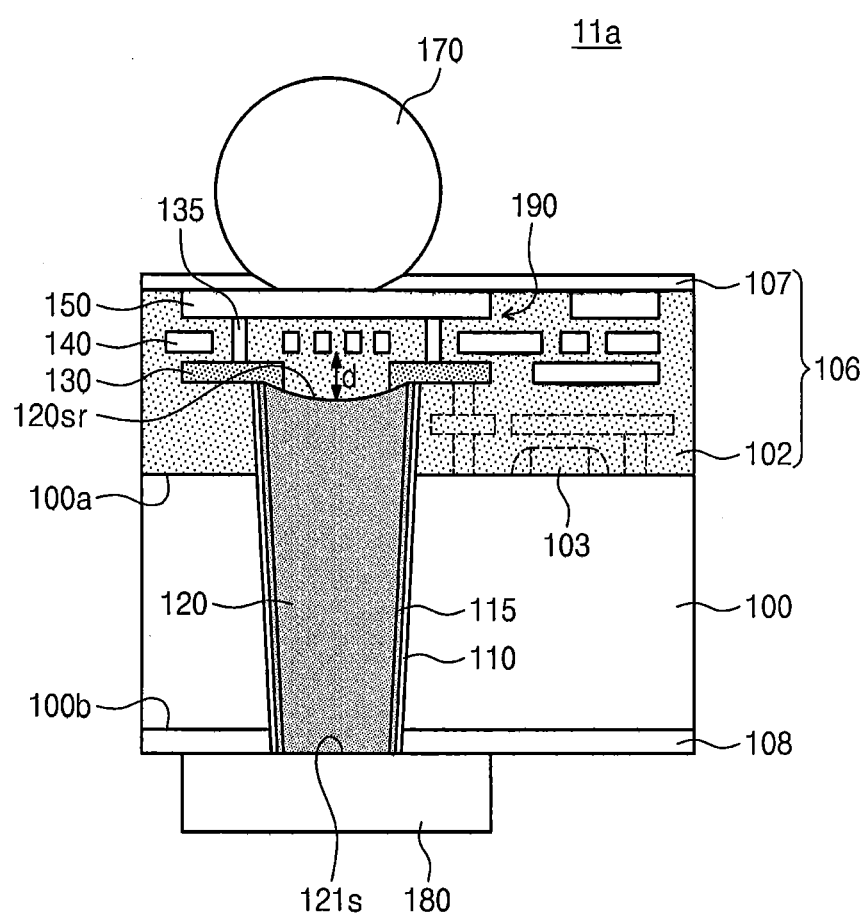
FIGS. 6A and 6B are cross-sectional views illustrating modified examples of FIG. 2.
Figure 6B:
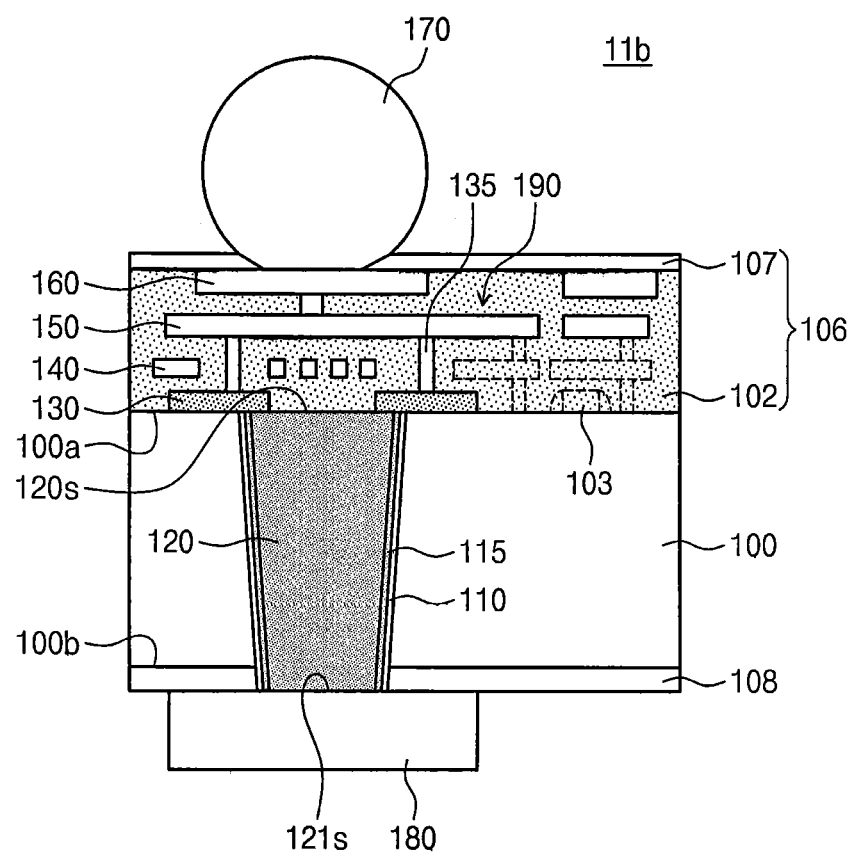

FIGS. 6A and 6B are cross-sectional views illustrating modified examples of FIG. 2.

Referring to FIG. 6A, a vertical interconnection 11a may include the through-electrode 120 having a recessed top surface 120sr. For example, when the through-electrode 120 is formed by depositing and planarizing a conductive material (e.g., copper), a dishing of the conductive material may occur, and the top surface 120sr of the through-electrode 120 may be recessed toward the active surface 100a of the semiconductor substrate 100 or the bottom surface 121s of the through-electrode 120. In this case, a distance d between the top surface 120sr and the second metal 140 may increase such that a parasitic capacitance between the through-electrode 120 and the second metal 140 may be reduced. A portion of the first metal 130 may extend toward the top surface 120sr of the through-electrode 120.

Referring to FIG. 6B, a vertical interconnection 11b may include the through-electrode 120 formed by a via last or via first scheme to penetrate the semiconductor substrate 100 while not penetrating the interlayer dielectric layer 102. The metal lines 190 may further include at least one fourth metal 160. In some embodiments, the at least one forth metal 160 may include metal lines including a metal pad coupled to the upper terminal 170.

The top surface 120s of the through-electrode 120 may be a flat surface that is coplanar with the active surface 100a of the semiconductor substrate 100. In some embodiments, the through-electrode 120 may have a recessed top surface 120s as illustrated in FIG. 6A. An insulating layer (now shown) may be further provided between the first metal 130 and the active surface 100a of the semiconductor substrate 100 so as to electrically insulate the first metal 130 from the semiconductor substrate 100.

Figure 7:
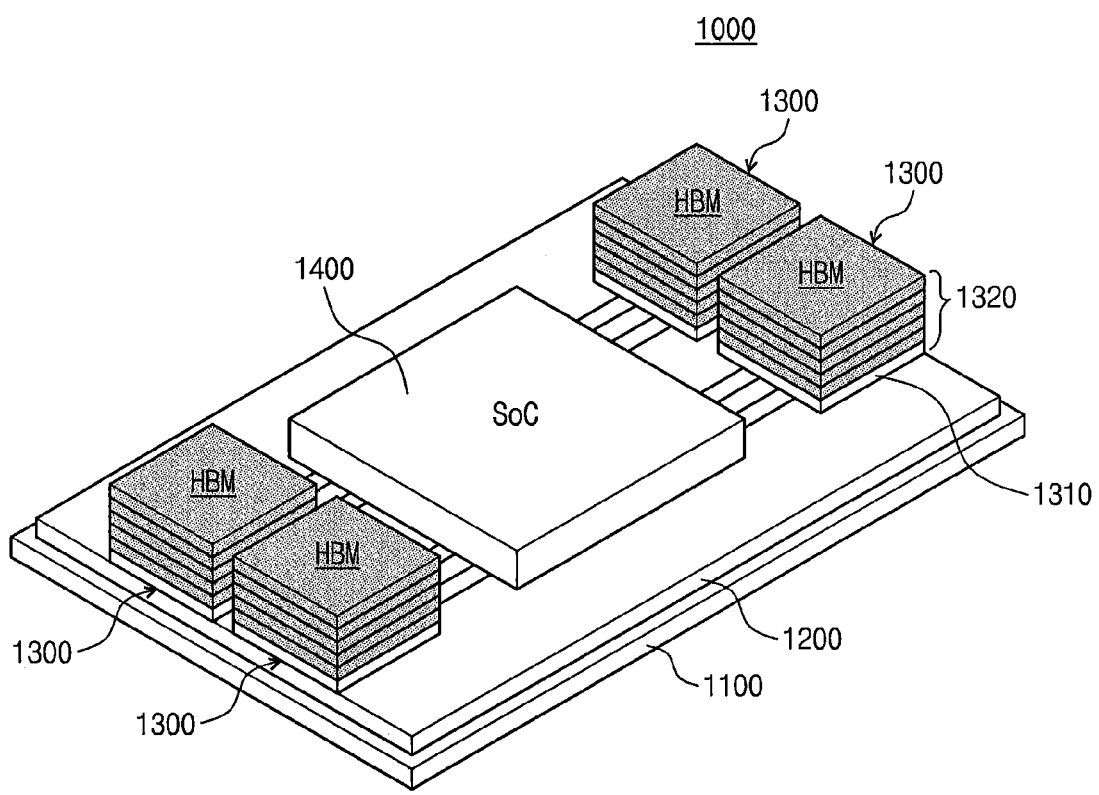
FIG. 7 is a perspective view illustrating a semiconductor module including a semiconductor device according to example embodiments of the inventive concepts.

FIG. 7 is a perspective view illustrating a semiconductor module including a semiconductor device according to example embodiments of the inventive concepts.

Referring to FIG. 7, a semiconductor device 1000 may include a memory module including a system-on-chip 1400 and at least one chip stack 1300 mounted on a package substrate 1100 such as, for example, a printed circuit board. An interposer 1200 may be further provided on the package substrate 1100. The chip stack 1300 may include at least one high-band memory (HBM) chip 1320 stacked on a base chip 1310 such as, for example, a logic chip. The high-band memory chip 1320 may include a semiconductor device according to example embodiments of the inventive concepts. As discussed with reference to FIG. 2, a semiconductor device according to example embodiments of the inventive concepts may reduce or possibly minimize a parasitic capacitance between the through-electrode 120 and the metal lines 190 and may be used as a high-band memory of about 500 GB/sec to about 1 TB/sec.

According to embodiments of the inventive concepts, a transmit speed of a semiconductor device may increase by reducing or possibly minimizing vertical overlaps and parasitic capacitances between metal lines and between metal lines and through-electrodes. Moreover, a through-electrode may have an oval-shaped top surface such that a sufficient contact between the through-electrode and a metal pad can be secured and a parasitic capacitance therebetween can be reduced. Further, an area occupied by the through-electrode is reduced to increase integration of a semiconductor device.

In some embodiments, the first metal may be a lower metal, and the second metal may be an upper metal.

Although the inventive concepts have been described in connection with the example embodiments illustrated in the accompanying drawings, it is not limited thereto. It will be apparent to those skilled in the art that various substitution, modifications and changes may be thereto without departing from the scope and spirit of the inventive concepts.

What is claimed is:
1. A semiconductor device comprising:
a semiconductor substrate;
a through-electrode penetrating vertically through the semiconductor substrate;
a circuit layer on the semiconductor substrate; and
a plurality of metal lines in the circuit layer, the plurality of metal lines including:

two first metals on respective ones of opposing edges of a top surface of the through-electrode; and a plurality of second metals above the through-electrode, wherein the plurality of second metals are disposed above the two first metals, and at least some of the plurality of second metals vertically overlap the top surface of the through-electrode and do not vertically overlap the two first metals, and wherein there is no metal line that is overlapped by the at least some of the plurality of second metals and is between the top surface of the through-electrode and the at least some of the plurality of second metals.

2. The semiconductor device of claim 1, wherein the top surface of the through-electrode has an oval shape that has a longer axis and a shorter axis, and wherein the opposing edges of the top surface of the through-electrode are on the longer axis.

3. The semiconductor device of claim 2, wherein the plurality of second metals extend in a direction that is substantially parallel to the shorter axis.

4. The semiconductor device of claim 2, wherein the two first metals are spaced apart from each other along the longer axis by a first distance, and a length of the top surface of the through-electrode along the longer axis is greater than the first distance.

5. The semiconductor device of claim 1, wherein no vertical line exists that intersects both one of the two first metals and one of the at least some of the plurality of second metals.

6. The semiconductor device of claim 1, wherein the top surface of the through-electrode is flat or recessed.

7. The semiconductor device of claim 1, further comprising a third metal above the plurality of second metals, wherein the third metal is electrically connected to at least one of the two first metals.

8. A semiconductor device comprising:
a through-electrode penetrating a semiconductor substrate, the through-electrode extending in a vertical direction;
a metal pad on the semiconductor substrate and on a top surface of the through-electrode; and
a metal line above and spaced apart from the top surface of the through-electrode,
wherein the metal pad includes a first pad and a second pad that contact respective ones of opposing edges of the top surface of the through-electrode,
wherein the metal line is between the first pad and the second pad in plan view such that the first and second pads do not vertically overlap the metal line, and
wherein there is no metal pad that is overlapped by the metal line and is between the top surface of the through-electrode and the metal line.

9. The semiconductor device of claim 8, wherein the top surface of the through-electrode has an oval shape that has a longer axis and a shorter axis, and a width of the top surface of the through-electrode along the longer axis is greater than a distance between the first pad and the second pad along the longer axis.

10. The semiconductor device of claim 9, wherein the metal line extends in a direction that is substantially parallel to the shorter axis.

11. The semiconductor device of claim 8, wherein the top surface of the through-electrode is recessed toward a bottom surface of the through-electrode.

12. The semiconductor device of claim 8, further comprising a dielectric layer between the through-electrode and the metal line, wherein the dielectric layer contacts an entirety of a portion of the top surface of the through-electrode that is exposed by the first and second pads.

13. A semiconductor device comprising:
a through-electrode extending through a substrate;
first and second lower metal patterns on the substrate, the first and second lower metal patterns contacting respective ones of opposing edge portions of an upper surface of the through-electrode and being spaced apart from each other to expose a central portion of the upper surface of the through-electrode; and
a plurality of upper metal patterns above the first and second lower metal patterns, at least some of the plurality of upper metal patterns overlapping the upper surface of the through-electrode and not overlapping the first and second lower metal patterns in plan view, and
wherein there is no lower metal pattern that is overlapped by the at least some of the plurality of upper metal patterns and is between the upper surface of the through-electrode and the at least some of the plurality of upper metal patterns.

14. The device of claim 13, wherein the upper surface of the through-electrode has a non-circular shape.

15. The device of claim 14, wherein the upper surface of the through-electrode has a longer axis and a shorter axis, and wherein the opposing edge portions of the upper surface of the through-electrode are on the longer axis of the upper surface of the through-electrode.

16. The device of claim 15, wherein the upper surface of the through-electrode has an oval shape.

17. The device of claim 15, wherein the plurality of upper metal patterns extend in a direction that is substantially parallel to the shorter axis of the upper surface of the through-electrode.

18. The device of claim 13, wherein the central portion of the upper surface of the through-electrode is recessed toward a lower surface of the through-electrode.

19. The device of claim 13, further comprising a dielectric layer on the central portion of the upper surface of the through-electrode.

20. The device of claim 13, wherein the at least some of the plurality of upper metal patterns are between the first and second lower metal patterns in plan view.

* * * * *